United States Patent
Mimura et al.

(10) Patent No.: US 10,128,344 B2
(45) Date of Patent: Nov. 13, 2018

(54) SEMICONDUCTOR DEVICE

(71) Applicant: TOYOTA JIDOSHA KABUSHIKI KAISHA, Toyota-shi, Aichi-ken (JP)

(72) Inventors: Tomohiro Mimura, Kariya (JP); Takashi Kanemura, Kariya (JP); Shoji Mizuno, Kariya (JP); Masahiro Sugimoto, Toyota (JP); Sachiko Aoi, Nagakute (JP)

(73) Assignee: TOYOTA JIDOSHA KABUSHIKI KAISHA, Toyota-shi (JP)

( * ) Notice: Subject to any disclaimer, the term of this patent is extended or adjusted under 35 U.S.C. 154(b) by 0 days.

(21) Appl. No.: 15/560,794

(22) PCT Filed: Mar. 10, 2016

(86) PCT No.: PCT/JP2016/001321
§ 371 (c)(1),
(2) Date: Sep. 22, 2017

(87) PCT Pub. No.: WO2016/152058
PCT Pub. Date: Sep. 29, 2016

(65) Prior Publication Data
US 2018/0114845 A1 Apr. 26, 2018

(30) Foreign Application Priority Data
Mar. 24, 2015 (JP) .................. 2015-061395

(51) Int. Cl.
*H01L 29/423* (2006.01)
*H01L 29/78* (2006.01)
(Continued)

(52) U.S. Cl.
CPC .......... *H01L 29/4236* (2013.01); *H01L 29/06* (2013.01); *H01L 29/105* (2013.01);
(Continued)

(58) Field of Classification Search
CPC combination set(s) only.
See application file for complete search history.

(56) References Cited

U.S. PATENT DOCUMENTS

| | | | |
|---|---|---|---|
| 2002/0106536 | A1 | 8/2002 | Lee et al. |
| 2005/0074982 | A1 | 4/2005 | Lee et al. |

(Continued)

FOREIGN PATENT DOCUMENTS

| | | | |
|---|---|---|---|
| JP | 2002-319583 | A | 10/2002 |
| JP | 2004-039813 | A | 2/2004 |

(Continued)

OTHER PUBLICATIONS

Japan Patent Office, English translation of the Written Opinion/ISA issued in the PCT application No. PCT/JP2016/001321, dated Oct. 5, 2017, 8 pages.

(Continued)

*Primary Examiner* — Ratisha Mehta
(74) *Attorney, Agent, or Firm* — Hunton Andrews Kurth LLP

(57) ABSTRACT

A semiconductor device includes: a drain region made of a first or second conductivity type semiconductors; a drift layer made of the first conductivity type semiconductor; a base region made of the second conductivity type semiconductor; a source region made of the first conductivity type semiconductor with higher concentration; a contact region made of the second conductivity semiconductor with higher concentration; a trench gate structure having upper and lower gate structures; a source electrode connected to the source and contact regions; and a drain electrode at a rear side of the drain region. The upper gate structure is inside the trench at an upper side, and includes a first gate insulation film and a first gate electrode. The lower gate structure is inside the trench at a lower side, and includes a second gate (Continued)

insulation film made of higher dielectric insulation material and a second gate electrode.

11 Claims, 2 Drawing Sheets

(51) Int. Cl.
    *H01L 29/06*     (2006.01)
    *H01L 29/12*     (2006.01)
    *H01L 29/10*     (2006.01)
    *H01L 29/16*     (2006.01)
    *H01L 29/40*     (2006.01)
    *H01L 29/51*     (2006.01)
    *H01L 29/739*     (2006.01)

(52) U.S. Cl.
    CPC .......... *H01L 29/12* (2013.01); *H01L 29/1608* (2013.01); *H01L 29/407* (2013.01); *H01L 29/512* (2013.01); *H01L 29/78* (2013.01); *H01L 29/7813* (2013.01); *H01L 29/517* (2013.01); *H01L 29/518* (2013.01); *H01L 29/7397* (2013.01)

(56) References Cited

U.S. PATENT DOCUMENTS

| | | |
|---|---|---|
| 2008/0064168 A1 | 3/2008 | Kraft et al. |
| 2009/0057754 A1 | 3/2009 | Kraft et al. |
| 2011/0284954 A1* | 11/2011 | Hsieh .................. H01L 29/1095 257/331 |
| 2011/0312138 A1 | 12/2011 | Yedinak et al. |
| 2012/0228637 A1* | 9/2012 | Nakabayashi ........ H01L 21/046 257/77 |
| 2012/0241855 A1 | 9/2012 | Nakazawa et al. |
| 2012/0241856 A1 | 9/2012 | Nakazawa et al. |
| 2014/0209999 A1* | 7/2014 | Sato .................... H01L 29/7813 257/330 |

FOREIGN PATENT DOCUMENTS

| | | | |
|---|---|---|---|
| JP | 2004039813 A | * | 2/2004 |
| JP | 2006-324570 A | | 11/2006 |
| JP | 2008-227514 A | | 9/2008 |
| JP | 2009-542002 A | | 11/2009 |
| JP | 2010-129973 A | | 6/2010 |
| JP | 2011-108701 A | | 6/2011 |
| JP | 2011-199109 A | | 10/2011 |
| JP | 2014-146666 A | | 8/2014 |

OTHER PUBLICATIONS

Japan Patent Office, International Search Report and Written Opinion issued in the PCT application No. PCT/JP2016/001321, dated Jun. 7, 2016, 9 pages.

\* cited by examiner

SEMICONDUCTOR DEVICE

CROSS REFERENCE TO RELATED APPLICATIONS

This is a national phase application based on the PCT International Patent Application No. PCT/JP2016/001321 filed on Mar. 10, 2016, claiming priority to Japanese Patent Application No. 2015-061395 filed on Mar. 24, 2015, the disclosure of both of which is incorporated herein by reference.

TECHNICAL FIELD

The present disclosure relates to a semiconductor device including a trench gate structure; in particular, is preferably to be applied to a semiconductor made of silicon carbide (hereinafter referred to as SiC).

BACKGROUND ART

It has been known that a semiconductor device including a trench gate structure is configured to have higher channel density for making a larger current flowing through the channel. In this type of trench gate structure, there is a structure having one gate electrode arranged directly below another gate electrode (hereinafter, the gate electrode arranged at an upper side is called a first gate electrode; and the gate electrode arranged at a lower side is called a second gate electrode) and having connection between the second gate electrode and a source potential (for example, see Patent Document 1). With this configuration, a decrease in parasitic capacitance Cgd and relaxation in electric field at the bottom of a trench gate can be achieved.

In a case of including a double gate structure with two sides respectively having the first gate electrode and the second gate electrode, since a shield effect can be achieved because of the first gate electrode and the second gate electrode, the parasitic capacitance Cgd (feedback capacitance) generated between the first gate electrode and the drain can be decreased. Accordingly, the double gate structure can achieve high-speed switching as compare to a MOSFET with a single gate structure, which does not have a second gate electrode. In addition, in a case of having the second gate electrode, an influx of a high potential into a gate insulation film at the upper side can be inhibited. Therefore, the concentration of electric field at the bottom part of the trench gate at the upper side can be relaxed, and the improvement in a withstand voltage can be achieved.

However, when a drift layer is set to have higher concentration for aiming lower on-resistance in the MOSFET with a double gate structure, a larger electric field is applied to the bottom part of the double gate structure, and hence insulation breakdown may occur on the gate insulation film. In particular, in a case where a semiconductor includes a double gate structure made of SiC, an even larger current is applied to the bottom of the double gate structure as compare to a case of a semiconductor including a double gate structure made of Si; therefore, insulation breakdown may be further occurred on the gate insulation film. Since there is a trade-off between a decrease in the on-resistance and the strength of electric field applied to the gate insulation film, it is difficult to have lower on-resistance while having an improvement in a withstand voltage. Hence, it is desired to have the structure to lower on-resistance while having an improvement in a withstand voltage.

PRIOR ART LITERATURES

Patent Literautre

Patent Literature 1: JP 2011-199109 A

SUMMARY OF INVENTION

It is an object of the present disclosure to provide a semiconductor device having a structure to have a lower on-resistance while having an improvement in a withstand voltage.

A semiconductor device according to an aspect of the present disclosure includes: a drain region that is made of a first conductivity type semiconductor or a second conductivity type semiconductor; a drift layer that is arranged on the drain region, and is made of the first conductivity type semiconductor, which has an impurity concentration lower than the drain region; a base region that is arranged on the drift layer, and is made of the second conductivity type semiconductor; a source region that is arranged on an upper part of the base region, and is made of the first conductivity type semiconductor, which has a concentration higher than the drift layer; a contact region that is arranged on the upper part of the base region, and is made of the second conductivity type semiconductor, which has a concentration higher than the base layer; a trench gate structure that includes an upper gate structure and a lower gate structure; a source electrode that is electrically connected to the source region and the contact region; and a drain electrode that is arranged at a rear side of the drain region. Additionally, the upper gate structure is arranged inside a trench at an upper side from a surface of the source region to a position, which is deeper than the base region; and includes: a first gate insulation film arranged from an opening of the trench to a position, which is deeper than the base region, and a first gate electrode arranged on the first gate insulation film. Moreover, the lower gate structure is arranged inside the trench at a lower side, and is arranged on an inner wall surface of the trench at a position, which is deeper than the first gate insulation film; and includes: a second gate insulation film made of an insulation material having a dielectric constant higher than the first gate insulation film, and a second gate electrode arranged on second gate insulation film.

Since the second gate insulation film at the lower side is made of an insulation material, which has a dielectric constant higher than the first gate insulation film at the upper side, the concentration of electric field can be relaxed. In other words, when the second gate insulation film is made of an insulation material with a higher dielectric constant, an influx of a high potential into the second gate insulation film can be inhibited as compare to a case where the second gate insulation film is made of an insulation material with a lower dielectric constant. Accordingly, an influx of an electric field into the first gate insulation film at the upper side is inhibited, spacing between equipotential lines becomes wider and the electric field concentration in the first gate insulation film is relaxed. Therefore, it is possible to inhibit insulation breakdown of the first gate insulation film by improving insulation between the first gate electrode and the drain.

Since the insulation breakdown of the first gate insulation film can be inhibited, it is possible to increase impurity concentration of the drift layer for lowering on-resistance so as to decrease internal resistance. Accordingly, it is possible to provide a semiconductor device to have lower on-resistance while having an improvement in insulation withstand voltage.

BRIEF DESCRIPTION OF DRAWINGS

The above and other objects, features and advantages of the present disclosure will become more apparent from the following detailed description made with reference to the accompanying drawings. In the drawings.

EMBODIMENTS FOR CARRYING OUT INVENTION

Figure 1:
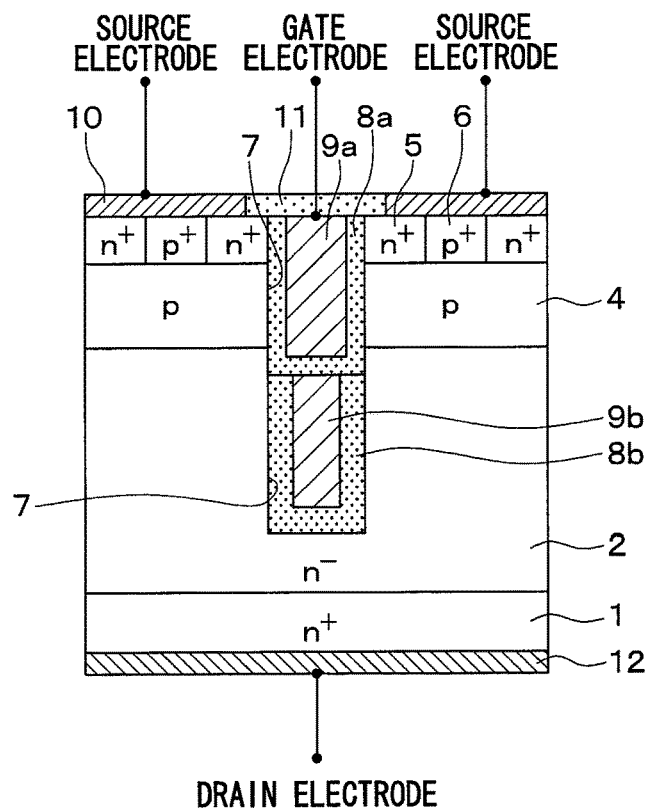
FIG. 1 is a drawing that illustrates a cross sectional configuration of a SiC semiconductor device according to a first embodiment of the present disclosure.

The following describes embodiments of the present disclosure based on the drawings. Note that in the following embodiments, portions identical or equivalent to each other, a description will be given the same reference numerals.

First Embodiment

The following describes a first embodiment of the present disclosure. Herein, a SiC semiconductor device formed by SiC is used as an example of semiconductors; however, a semiconductor formed by, for example, Si may also be used for configuring a semiconductor.

Firstly, the SiC semiconductor device having a vertical type MOSFET with an inversion type trench gate structure is described with reference to FIG. 1. It is noted that only one-cell part of the vertical type MOSFET is illustrated in FIG. 1, the structure similar to the vertical type MOSFET illustrated in FIG. 1 can also be provided with a plurality of cells, which are adjacent to each other. The one-cell refers to the center of the after-mentioned p+ type contact region 6 to the center of the adjacent p+ type contact region 6, and the trench gate structure is arranged between the both of p+ type contact regions 6.

As illustrated in FIG. 1, the SiC semiconductor device is formed by using an n+ type semiconductor substrate 1 comprising a SiC single crystal with a thickness of 300 μm, and the semiconductor substrate 1 is doped with n-type impurities (such as phosphor or nitrogen) with high concentration of impurities about $1 \times 10^{19}$ to $1 \times 10^{20}$ cm$^{-3}$. On the n+ type semiconductor substrate 1, an n-type drift layer 2 comprising SiC with a thickness of about 5 μm to 15 μm is formed, In addition, the n-type drift layer 2 is doped by n-type impurities with impurity concentration about $1 \times 10^{15}$ to $1 \times 10^{16}$ cm$^{-3}$.

Additionally, on the surface of the n-type drift layer 2, a p-type base region 4 comprising SiC is formed. The p-type base region 4 is a layer in which a channel region of the vertical type MOSFET is configured. At both sides of a trench 7 configuring the after-mentioned trench gate structure, the p-type base region is formed so as to have a contact with the side surface of the trench 7. The p-type base region 4 is doped by p-type impurities with an impurity concentration of, for example, between $1 \times 10^{15}$ and $1 \times 10^{18}$ cm$^{-3}$, and have a thickness of, for example, about 0.7 μm to 1.8 μm.

At the side of the trench 7 at the surface layer part of the p-type base region 4, an n+ type source region 5, which is doped by n-type impurities with a higher concentration, is formed so as to have a contact with the trench gate structure. In the present embodiment, for example, the n+ type source region 5 is formed with, for example, ion injection into the p-type base region 4, and is formed with an impurity concentration of about $1 \times 10^{21}$ cm$^{-3}$ and with a thickness of about 0.3 μm. In addition, the p+ type contact region 6 doped with a higher concentration of p-type impurities is formed at a position opposite to the trench 7, which holds the n+ type source region 5 at the surface layer part of the p-type base region 4. In this present embodiment, for example, the p+ type contact region 6 is formed by, for example, ion injection into the p-type base region 4, and is formed so as to have the impurity concentration of about $1 \times 10^{21}$ cm$^{-3}$ and with a thickness of about 0.3 μm.

Moreover, the trench 7 is formed such that the trench 7 penetrates the p-type base region 4 and the n+ type source region 5 and reaches the drift layer 2; and the bottom part of the trench 7 is set as the depth, which is away from the surface of the n+ type semiconductor substrate 1 with a predetermined distance. Accordingly, the p-type base region 4 and the n+ type source region 5 are arranged to have a contact with the side surface of the trench 7.

The double gate structure is configured in the trench 7. Particularly, inside the trench 7, an upper gate structure including a first gate insulation film 8a and a first gate electrode 9a is arranged at the upper side of the trench 7 as the opening side of the trench 7; and a lower gate structure including a second gate insulation film 8b and a second gate electrode 9b is arranged at the lower side of the trench 7.

The first gate insulation film 8a arranged at the upper gate structure is made of an insulation film, such as a silicon oxide film (SiO$_2$), having relatively smaller dielectric constant, and has a film thickness of, for example, about 50 nm to 100 nm. The first gate electrode 9a is formed from the surface of the trench 7 to a position deeper than the bottom part of the p-type base region 4. The first gate electrode 9a is made of Poly-Si doped by impurities, and may be applied by a gate voltage by connecting the first gate electrode 9a to a gate wiring (not shown). Accordingly, when the gate voltage is applied, a channel may be formed at the side surface of the trench 7 at the p-type base region 4, in other words, at the entire region of a part which is opposite to the first gate electrode 9a. With regard to the depth of the upper gate structure including the whole first gate insulation film 8a and the whole first gate electrode 9a, it is preferable that the bottom part of the first gate electrode 9a is at the position, which is deeper than the bottom part of the p-type base region 4. For example, the depth of the upper gate structure is set between 0.8 μm and 2 μm.

The second gate insulation film 8b arranged at the lower gate structure is made of an insulation film having a dielectric constant larger than the dielectric constant of the first gate insulation film 8a. For example, the second gate insulation film 8b may be formed by one of silicon nitride oxide, silicon nitride, aluminum oxide, aluminum nitride, hafnium oxide, hafnium nitride, titanium oxide, zirconium oxide, and rare earth oxide (for example, lanthanum oxide, cerium oxide, and yttrium oxide), or by the mixture of two or more of the above chemical compounds, or by the lamination layers of two or more of the above chemical compounds. The thickness of the second gate insulation film 8b may be set arbitrarily; however, it is preferable to set the film thickness to be larger than or equal to the thickness of the first gate insulation film 8a. In the present embodiment, for example, the film thickness is set about between 50 nm and 100 nm. The second gate electrode 9b is formed from the bottom part of the upper gate structure, which is a part of the trench 7, to a position, which is shallower than the position of the n+ semiconductor substrate 1. In other words, the second gate electrode 9b is formed within the thickness of the n-type drift layer 2. The second gate electrode 9b is connected to the after-mentioned source electrode 10 at other the cross section, which is different from FIG. 1, and is set as a source potential. The second gate electrode 9b is made of Poly-Si, which is doped with impurities. With regard to the depth of the lower gate structure including the whole second gate insulation film 8b and the whole second gate electrode 9b, the depth may be set arbitrarily as long as the lower gate structure is formed within the thickness of the n-type drift layer 2, the depth is set, for example, between 0.8 μm and 2 μm from the bottom part of the upper gate structure.

With the above configuration, the trench gate structure is made of the double gate structure including the upper gate structure and the lower gate structure inside the trench 7.

Although it is not illustrated in FIG. 1, the trench gate structure is configured, for example, in a strip form in a paper vertical direction as a longitudinal direction; and the plurality of trench gate structures are configured to include a plurality of cells by arranging the plurality of trench gate structures into a stripe shape with an equal interval in a paper horizontal direction.

At the surface of the n+ type source region 5 and the p+ contact region 6, a source electrode 10 is formed. The source electrode 10 is made of a plurality of metals (for example, Ni/Al). Specifically, the part of the source electrode 10 connected to the n+ source region 5 is made of the metal, which can have an ohmic contact with n-type SiC; and the part of the source electrode 10 connected to the p-type base region 4 through the p+ contact region 6 is made of the metal, which can have an ohmic contact with p-type SiC. The source electrode 10 is electrically isolated from the gate wiring (not shown), which is electrically connected to the first gate electrode 9a. The source electrode 10 then has an electrical contact with the n+ type source region 5 and the p+ type contact region 6 through a contact hole formed at an interlayer insulation film 11.

A drain electrode 12 electrically connected to the n+ type semiconductor substrate 1 is formed at the rear side of the n+ type semiconductor substrate 1. According to this kind of configuration, the vertical type MOSFET having an inversion type channel gate structure with n-channel type is configured.

With regard to the vertical type MOSFET as described above, when a gate voltage is applied to the first gate electrode 9a, the part of the p-type base region 4 having a contact with the side surface of the trench 7 becomes an inversion type channel and then a current flows between the source electrode 10 and the drain electrode 12.

On the other hands, a higher voltage (for example, 1200V) is applied as the drain voltage in a situation where a gate voltage is not applied. In the SiC having electric field breakdown strength, which is nearly 10 times larger than a silicon device, with an influence of the higher voltage, the electric field having 10 times larger than the silicon device is applied to the trench gate structure, and then the electric field concentration occurs.

However, in this present embodiment, since the second gate insulation film 8b at the lower side is made of an insulation material having higher dielectric constant than the first gate insulation film 8a located at the upper side, the electric field concentration can be relaxed. In other words, when the second gate insulation film 8b is made of the insulation material having higher dielectric constant, an influx of the higher voltage into the second gate insulation film 8b can be inhibited as compared to the situation where the second gate insulation film 8b is made of the insulation material having lower dielectric constant. Accordingly, the influx of electric field into the first gate insulation film 8a at the upper side can be inhibited, and the interval between equipotential lines inside the first gate insulation film 8a becomes wider; and therefore, the electric field concentration inside the first gate insulation film 8a can be relaxed. Thus, it is possible to inhibit insulation breakdown of the first gate insulation film 8a, which provides insulation between the first gate electrode 9a and the drain.

Herein, it is also considered that the first gate insulation film 8a is also made of a film with a higher dielectric constant as similar to the second gate insulation film 8b made of a film with a higher dielectric constant. However, in a situation where the first gate insulation film 8a is made of a film with a higher dielectric constant, the film thickness becomes larger as compared to the situation of having a film with a lower dielectric constant in order to achieve the capacity of oxide film, which is the same as the capacity of oxide film in the situation of forming a film with a lower dielectric constant.

For example, the dielectric constant of a silicon oxide film, which is an example of insulation material for configuring the first gate insulation film 8a, is 4. Additionally, the dielectric constant of aluminum oxide, which is an example of insulation material for configuring the second gate insulation film 8b, is about 8; the dielectric constant of hafnium oxide is about 16; the dielectric constant of lanthanum oxide is about 20; and the dielectric constant of cerium oxide is about 20. In a situation where the first gate insulation film 8a and the second gate insulation film 8b are made of the same material, the film thickness of the first gate insulation film 8a has to be made larger so that the thickness matches to the ratio of the dielectric constants. For example, in a situation where the first gate insulation film 8a is made of ratanhia, it is necessary to make the film thickness to be 5 times larger than the film thickness of the first gate insulation film 8a, which is made of a silicon oxide film. When the film thickness of the first gate insulation film 8a is made to be larger as described above, it is difficult to miniaturize an element. Therefore, it is preferable to make the film thickness of the first gate insulation film 8a to be smaller.

In contrast, in the present embodiment, the insulation material for configuring the first gate insulation film 8a is made to have a lower dielectric constant than the insulation material for configuring the second gate insulation film 8b. Accordingly, it is possible to make the film thickness of the first gate insulation film 8a to be smaller as compared to the situation where the first gate insulation film 8a and the second gate insulation film 8b are made of the same material. Accordingly, it is possible to miniaturize the element.

As described above, the second gate insulation film 8b is configured to by the insulation material having a higher dielectric constant than the first gate insulation film 8a. Therefore, the electric field concentration can be relaxed inside the first gate insulation film 8a. Since the insulation breakdown of the first gate insulation film 8a can be inhibited, it is possible to increase the impurity concentration of the n-type drift layer 2 to lower the internal resistance for having a lower on-resistance. Accordingly, it is possible to provide a SiC semiconductor device that aims a lower resistance while improving an insulation withstand voltage.

The film thickness of the second gate insulation film 8b can be set arbitrarily. In this type of trench gate structure, the first insulation film 8a is the one to be protected from insulation breakdown but not the second gate insulation film 8b. However, if the film thickness of the second gate insulation film 8b is set too short, then it is possible that the switching speed of the vertical type MOSFET gets slower due to having larger capacitance between the second gate electrode 9b and the drain. Accordingly, it is preferable to set the film thickness of the second gate insulation film 8b to be larger than or equal to the film thickness of the first gate insulation film 8a.

With regard to the manufacturing method of the SiC semiconductor device according to the present embodiment, although it is essentially similar to the conventional method, only the formation of a trench gate structure is modified from the conventional method. For example, subsequent to the formation of the trench 7 through etching, the second gate insulation film 8b is formed by, for example, CVD (chemical vapor deposition) or ALD (atomic layer deposition) for covering the inner wall surface of the trench 7. Moreover, the second gate electrode 9b is formed at the surface of the second gate insulation film 8b. Subsequently, through the etch-back, an unnecessary part of the second gate electrode 9b and the second gate insulation film 8b is removed until a position of the trench 7 which is deeper than the p-type base region 4. Accordingly, a lower gate structure is formed. Subsequently, the first gate insulation film 8a is formed by, for example, CVD or ALD for covering the side wall surface of the trench 7 and the upper surface of the lower gate structure, and further the first gate electrode 9a is formed at the surface of the first gate insulation film 8a. Subsequently, through the etching, the unnecessary part of the first gate electrode 9a and the first gate insulation film 8a at the outer part of the trench 7 is removed. Accordingly, the upper gate structure is formed, and the trench gate structure with the double gate structure is formed. If the trench gate structure is formed according to this kind of manufacturing method, with regard to the subsequent steps, the SiC semiconductor device according to the present embodiment according to the method similar to the conventional method.

Second Embodiment

A second embodiment of the present disclosure is described. The present embodiment related to the structure that aims for further having a higher withstand voltage as compared to the first embodiment. Since the other parts of the present disclosure are similar to the ones in the first embodiment, only the parts different from the first embodiment are described.

Figure 2:
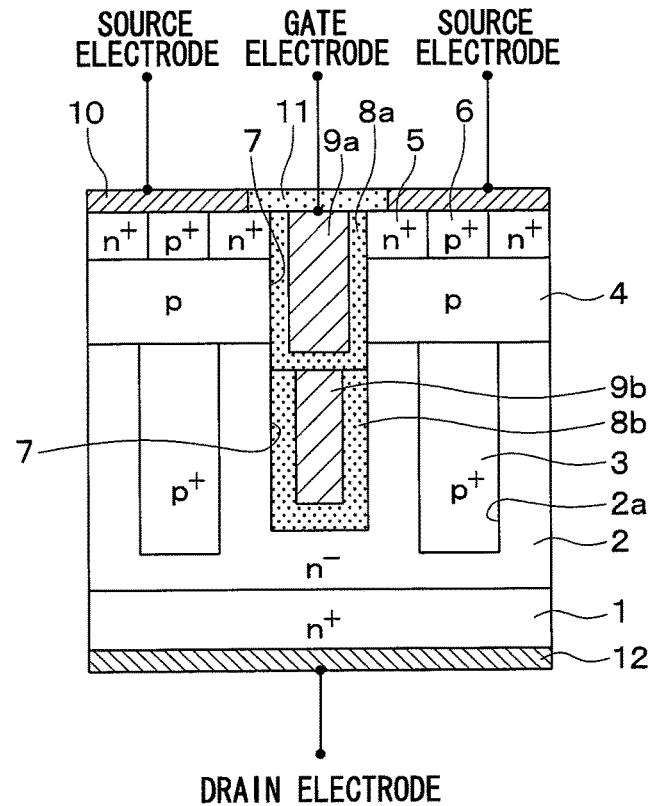
FIG. 2 is a drawing that illustrates a cross sectional configuration of a SiC semiconductor device according to a second embodiment of the present disclosure.

As shown in FIG. 2, in the SiC semiconductor device according to the present embodiment, at the both sides of the trench gate structure, a p-type deep layer 3 is formed so as to be away from the trench 7 with a predetermined distance. In this present embodiment, the p-type deep layer 3 is configured to be parallel to the trench 7, in other words, is configured into a strip form in a paper vertical direction of FIG. 2 as a longitudinal direction. The plurality of p-type deep layers 3 are arranged in a stripe form, and are made of the layout in which the trench 7 is arranged between each of the plurality of p-type deep layers 3. In particular, at the both sides of the position where the trench 7 is formed, a recess part (a first recess part) 2, which is partially hollow inside the recess part 2, and the p-type deep layer 3 is formed by burying the p-type layer, which is doped by p-type impurities, inside the recess part 2. The p-type deep layer 3 is configured such that the p-type impurity concentration is higher than the p-type base region 4, and is set to have a concentration of, for example, about between $1\times10^{17}$ and $1\times10^{19}$ cm$^{-3}$.

Thus, the SiC semiconductor device according to the present embodiment is configured to have the p-type deep layer 3. Accordingly, a depletion layer at a PN junction part between the p-type deep layer 3 and the n-type drift layer 2 is largely stretched to the n-type drift layer side 2, and the higher voltage due to the influence of the drain voltage gets harder to enter the second gate insulation film 8b.

Accordingly, the higher voltage becomes harder to get into the first gate insulation film 8a, and the electric field concentration inside the first gate insulation film 8a, in particular, the electric field concentration at the bottom part of the trench 7 as a part of the first gate insulation film 8a can be relaxed. Accordingly, the SiC semiconductor device can withstand a higher voltage because the insulation breakdown of the first gate insulation film 8a can be inhibited.

Third Embodiment

A third embodiment of the present disclosure is described. The present embodiment related to the structure that aims for further having a higher withstand voltage as compared to the first embodiment. Since the other parts of the present disclosure are similar to the ones in the first embodiment, only the parts different from the first embodiment are described.

Figure 3:
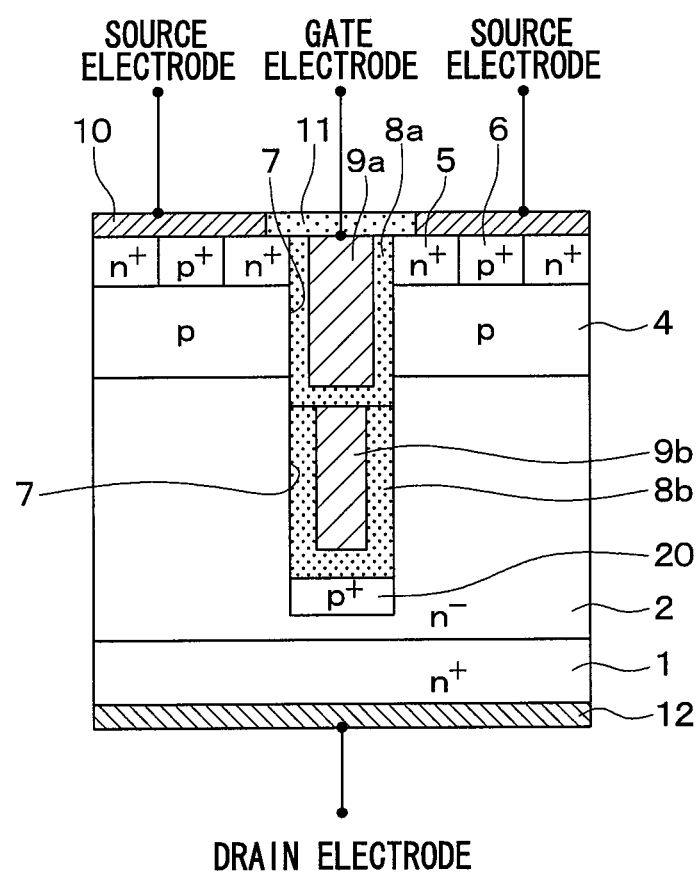
FIG. 3 is a drawing that illustrates a cross sectional configuration of a SiC semiconductor device according to a third embodiment of the present disclosure.

As shown in FIG. 3, in the SiC semiconductor device according to the present embodiment, a p-type bottom layer 20 is formed at the surface layer part of the n-type drift layer 2 at the bottom of the trench gate structure. In the present embodiment, the p-type bottom layer 20 is formed at the entire region of the bottom part of the trench 7, in other words, formed into a strip form in a paper vertical direction of FIG. 3 as a longitudinal direction. For example, subsequent to the formation of the trench 7, the p-type bottom layer 20 is formed by ion injection of p-type impurities in a state where the parts other than the trench 7 are covered by a mask. The p-type bottom layer 20 is configured such that the p-type impurity concentration is higher than the p-type base region 4, and is set to have a concentration of, for example, about between $1\times10^{17}$ and $1\times10^{19}$ cm$^{-3}$.

Thus, the SiC semiconductor device according to the present embodiment is configured to have the p-type bottom layer 20. Accordingly, a depletion layer at a PN junction part between the p-type bottom layer 20 and the n-type drift layer 2 is largely stretched to the n-type drift layer side 2, and the higher voltage due to the influence of the drain voltage gets harder to enter the second gate insulation film 8b.

Accordingly, the higher voltage becomes harder to get into the first gate insulation film 8a, and the electric field concentration inside the first gate insulation film 8a, in particular, the electric field concentration at the bottom part of the trench 7 as a part of the first gate insulation film 8a can be relaxed. Accordingly, the SiC semiconductor device can withstand a higher voltage because the insulation breakdown of the first gate insulation film 8a can be inhibited.

It is noted that, when the p-type bottom layer 20 formed at the bottom part of the trench 7 such as the one disclosed in the present embodiment is formed by ion injection, it is preferable that the side surface of the trench 7 is perpendicular to the substrate; or the bottom part of the trench 7 is made to have a larger width than the width of the opening of the trench 7 so as to make the side surface of the trench 7 formed into an inverse taper shape. When the side surface of the trench 7 is tilted, the ion injection can be performed on the side surface so that it is possible to vary the element characteristics of the vertical type MOSFET.

Other Embodiments

The present disclosure is not only limited to the above embodiments, but also possible to be modified within the technical scope described in the present disclosure.

For example, the layout of the p-type deep layer 3 described in the second embodiment is one example. However, it is not only restricted to the case where the p-type deep layer 3 is formed to be parallel to the trench 7. The p-type deep layer 3 may be formed so as to intersect with the trench 7, or also may be formed into a dot shape or a mesh shape. Additionally, the trench 7 may not be only formed into a stripe shape; however, the trench 7 may also formed into a dot shape or a mesh shape.

In addition, the structure may also include the p-type deep layer 3 described in the second embodiment and the p-type bottom layer 20 described in the third embodiment.

The above embodiments describe the SiC semiconductor device as an example; however, the semiconductor device may also be made of other semiconductor material such as Si. In the case of the SiC semiconductor device described in each of the embodiments, the n-type drift layer 2 is formed on the n+ type semiconductor substrate 1 for configuring the drain region. However, the n-type drift layer 2 may be made of n-type substrate so as to form the drain region configured at the n+ type layer by, for example, performing ion injection of n-type impurities at the rear side of the n-type substrate.

In the second embodiment, the p-type deep layer 3 is formed to be deeper than the trench 7, the p-type deep layer 3 may be formed to be deeper than at least the upper gate structure. In other words, since the first gate insulation film 8a is to be protected from insulation breakdown at the p-type deep layer 3, the relaxation of electric field concentration may be aimed inside the first gate insulation film 8a. Accordingly, the effect of electric field concentration inside the first gate insulation film 8a can be achieved by making at least the p-type deep layer 3 to be located deeper than the upper gate structure.

The above embodiments describe an example of the n-channel type MOSFET with n-type as a first conductivity and p-type as a second conductivity. However, the present disclosure may also be applied to a p-channel type MOSFET in which the conductivity of each configuration element is inverted. Additionally, the above description states an example of the MOSFET with a trench gate structure; however, the present disclosure may also be applied to an IGBT with the similar trench gate structure. In a case of using the IGBT, only the conductivity type of the substrate 1 is modified from n-type to p-type as compared to the above embodiments. With regard to the other structures and manufacturing methods, they are similar to the ones described in each embodiment.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A semiconductor device comprising:
    a drain region that is made of a first conductivity type semiconductor or a second conductivity type semiconductor;
    a drift layer that is arranged on the drain region, and is made of the first conductivity type semiconductor, which has an impurity concentration lower than the drain region;
    a base region that is arranged on the drift layer, and is made of the second conductivity type semiconductor;
    a source region that is arranged on an upper part of the base region, and is made of the first conductivity type semiconductor, which has a concentration higher than the drift layer;
    a contact region that is arranged on the upper part of the base region, and is made of the second conductivity type semiconductor, which has a concentration higher than the base layer;
    a trench gate structure that includes an upper gate structure and a lower gate structure;
    a source electrode that is electrically connected to the source region and the contact region; and
    a drain electrode that is arranged at a rear side of the drain region, wherein:
    the upper gate structure is arranged inside a trench at an upper side from a surface of the source region to a position, which is deeper than the base region;
    the upper gate structure includes
        a first gate insulation film arranged from an opening of the trench to a position, which is deeper than the base region, and
        a first gate electrode arranged on the first gate insulation film;
    the lower gate structure is arranged inside the trench at a lower side, and is arranged on an inner wall surface of the trench at a position, which is deeper than the first gate insulation film; and
    the lower gate structure includes
        a second gate insulation film made of a uniform insulation material having a dielectric constant higher than the first gate insulation film, and
        a second gate electrode arranged on the second gate insulation film
    wherein the second gate insulation film extends from the first gate insulation film to a bottom of the trench.

2. The semiconductor device according to claim 1, wherein:
    the first gate insulation film is made of a silicon oxide film; and
    the second gate insulation film is made of an insulation material having a dielectric constant higher than the silicon oxide film.

3. The semiconductor device according to claim 2, wherein the second gate insulation film is made of one of silicon nitride oxide, silicon nitride, aluminum oxide, aluminum nitride, hafnium oxide, hafnium nitride, titanium oxide, zirconium oxide, and rare earth oxide.

4. The semiconductor device according to claim 2, wherein the second gate insulation film is made of a mixture including two or more of silicon nitride oxide, silicon nitride, aluminum oxide, aluminum nitride, hafnium oxide, hafnium nitride, titanium oxide, zirconium oxide, and rare earth oxide.

5. The semiconductor device according to claim 2,
wherein the second gate insulation film is made of a lamination layer including two or more of silicon nitride oxide, silicon nitride, aluminum oxide, aluminum nitride, hafnium oxide, hafnium nitride, titanium oxide, zirconium oxide, and rare earth oxide.

6. The semiconductor device according to claim 1, further comprising:
a second conductivity type deep layer that is arranged inside the drift layer located below the base region, and that is arranged to be deeper than the upper gate structure, and that has a second conductivity type impurity concentration higher than the base region.

7. The semiconductor device according to claim 1, further comprising:
a second conductivity type bottom layer that is arranged inside the drift layer at the bottom part of the trench, and that is configured to have a second conductivity type impurity concentration higher than the base region.

8. The semiconductor device made of silicon carbide according to claim 1,
wherein a semiconductor for configuring the semiconductor device is made of silicon carbide.

9. The semiconductor device according to claim 1, further comprising:
an interlayer insulation film,
wherein the interlayer insulation film is at a surface layer of the source electrode.

10. The semiconductor device according to claim 9,
wherein the source electrode is electrically isolated from a gate wiring, which is electrically connected to the first gate electrode.

11. The semiconductor device according to claim 1,
wherein the second gate insulation film covers both sides of the second gate electrode, and covers a bottom side of the second gate electrode.

* * * * *